United States Patent
Shimizu et al.

[11] Patent Number: 5,972,729
[45] Date of Patent: Oct. 26, 1999

[54] METHOD OF MANUFACTURING LIGHT-RECEIVING/EMITTING DIODE ARRAY CHIP

[75] Inventors: Takatoku Shimizu; Mitsuhiko Ogihara; Masumi Taninaka; Hiroshi Hamano, all of Tokyo, Japan

[73] Assignee: Oki Electric Industry Co., Ltd., Tokyo, Japan

[21] Appl. No.: 09/031,534

[22] Filed: Feb. 27, 1998

[30] Foreign Application Priority Data

Apr. 11, 1997 [JP] Japan .................................... 9-093562

[51] Int. Cl.⁶ .................................................. H01L 33/00
[52] U.S. Cl. .................................. 438/34; 438/33; 438/68; 438/73; 438/113; 438/462; 438/975; 257/620
[58] Field of Search ............................ 438/33, 34, 68, 438/73, 107, 110, 113, 114, 460, 462, 975; 257/88, 443, 446, 620

[56] References Cited

U.S. PATENT DOCUMENTS

| 5,053,836 | 10/1991 | McClurg . |
| 5,430,325 | 7/1995 | Sawada et al. . |
| 5,523,590 | 6/1996 | Ogihara et al. . |

FOREIGN PATENT DOCUMENTS

| 2-8067 | 1/1990 | Japan . |
| 4-503285 | 6/1992 | Japan . |
| 05259505 | 10/1993 | Japan . |
| 5-259505 | 10/1993 | Japan . |
| 5-294011 | 11/1993 | Japan . |
| 06085057 | 3/1994 | Japan . |
| 06085318 | 3/1994 | Japan . |
| 06085319 | 3/1994 | Japan . |
| 06085320 | 3/1994 | Japan . |

*Primary Examiner*—Chandra Chaudhari
*Assistant Examiner*—Keith Christianson
*Attorney, Agent, or Firm*—Venable; Robert J. Frank

[57] ABSTRACT

A method of manufacturing a light-emitting or a light-receiving diode array chip. A first interlayer dielectric is formed in each of a plurality of chip areas on a substrate of a first conductivity type. Impurity diffusion regions of a second conductivity type are formed in the substrate using the first interlayer dielectric as a diffusion mask. An electrode is formed in contact with each of the impurity diffusion regions. The substrate is separated so that the plurality of chip areas are separated into individual chips. A second interlayer dielectric may be formed on the first interlayer dielectric after forming the impurity diffusion regions. The second interlayer dielectric is formed such that the second interlayer dielectric is absent from a second area along which the substrate is separated into the individual chips, at least in the vicinity of the last one of a plurality of windows. Island-shaped patterns may be formed on the interlayer dielectric so as to hold the interlayer dielectric onto the substrate. The first interlayer dielectric may be removed such that the first interlayer dielectric is absent from the second area, at least in the vicinity of the last one of the plurality of windows.

11 Claims, 10 Drawing Sheets

METHOD OF MANUFACTURING LIGHT-RECEIVING/EMITTING DIODE ARRAY CHIP

BACKGROUND OF THE INVENTION

1. Field of the Invention

The present invention relates to a method of manufacturing light-receiving or emitting diode array chips. The term light-receiving or emitting diode is used to cover both a light emitting diode and a light-receiving diode.

2. Description of Prior Art

Light-emitting diode arrays are usually used as a light source for use in, for example, electrophotographic printers. This type of light-emitting diode array is manufactured by arranging a plurality of light-emitting diode array chips (referred to as chip hereinafter) in line on a printed circuit board. For example, Japanese Utility Model (KOKAI) No. 2-8067 discloses a method of manufacturing the chips.

According to the method, a semiconductor substrate of a first conductivity type has an interlayer dielectric thereon formed in each of a plurality of areas. The interlayer dielectric is formed with a plurality of windows therein. The plurality of areas will be separated into individual chips at a later stage of the manufacturing process. The windows are arranged in array form at predetermined intervals. The interlayer dielectric is used as a diffusion mask so as to form impurity diffusion areas of a second conductivity type in the substrate. Then, an electrode is formed on the interlayer dielectric for each impurity diffusion area. Then, the substrate having the electrodes (referred to as wafer hereinafter) formed thereon is cut into individual chips. The contour of the interlayer dielectric is used as a positioning mark for a separator (typically, a dicing blade) during the separation stage, allowing high precision separation. A single interlayer dielectric may have some pin holes therein which cause the individual electrodes to be electrically short-circuited to the substrate. In order to prevent this type of short-circuit, it is common practice to form a second interlayer dielectric on a first interlayer dielectric.

A plurality of chips are arranged side by side on a printed circuit board in order to make a long line of light-receiving/emitting elements. If the light-receiving elements or light-emitting elements in each chip are arranged at predetermined intervals of P, then each chip after the dicing process must have a dimensional margin of less than P/2 at the extremities of the aligned light-receiving/emitting elements. This is necessary in order to arrange adjacent chips on the circuit board such that the distance between the last light-emitting elements on the adjacent chips is equal to the interval P.

The higher resolution the light-receiving diode array or light-emitting diode array is to have, the smaller the interval P must be. Accordingly, the chips need to have as small a dimensional margin at longitudinal ends thereof as possible.

As the dimensional margin at the ends of the chip is made smaller, there will be a greater chance that the dicing blade will cut parts of the interlayer dielectric. This gives rise to a problem that the interlayer tends to become detached from the substrate. This problem will be described in more detail with reference to FIGS. 11–13.

Figure 11:
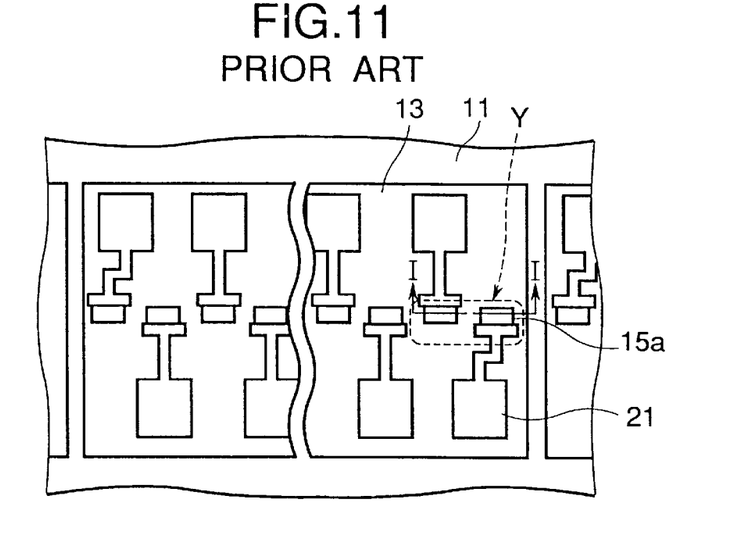
FIG. 11 is a top view of a prior art substrate, showing a relevant portion.
Figure 12:
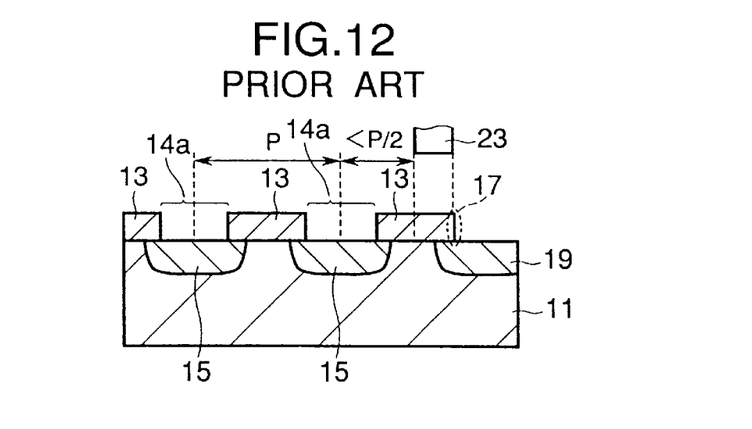
FIG. 12 is an enlarged cross-sectional view taken along lines I—I of FIG. 11.
Figure 13:
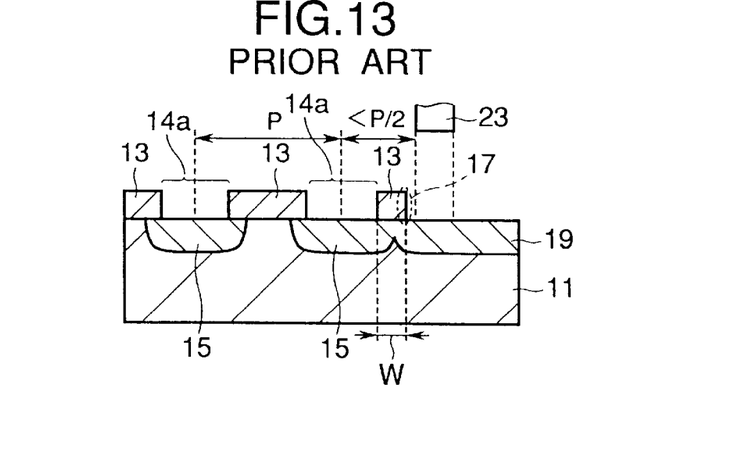
FIG. 13 is a cross-sectional view when the impurity diffusion area of the last light-emitting element 15a of a row of light-emitting elements reaches unused impurity diffusion area.

FIG. 11 is a top view of the prior art wafer disclosed in the aforementioned KOKAI No. 2-8067, showing some of the relevant areas which will be separated into individual chips at a later stage of the manufacturing process. FIGS. 12 and 13 are enlarged cross-sectional views taken along lines I—I of an area indicated by Y. Electrodes are not shown for simplicity of explanation. FIG. 13 shows a cross-sectional view when the impurity diffusion area of the last light-emitting element 15a reaches an unused impurity diffusion area.

The interlayer dielectric 13 is formed on the substrate 11 of the first conductivity type and has windows 14a formed therein. A positioning mark 17 is formed at an edge line of the interlayer dielectric 13 and is used for positioning of a dicing blade 23. An unused impurity diffusion area 19 of the second conductivity type is formed adjacent the positioning mark 17 (edge line of the interlayer dielectric 13), next to the last impurity diffusion area 15. The individual electrodes are depicted at 21.

In order to cut the wafer into individual chips, a dicing operation is performed both in the longitudinal direction (horizontal direction in FIG. 11) and in the lateral direction (vertical direction in FIG. 11). A high precision dicing is required when cutting the wafer in the lateral direction because the blade position relative to the light-emitting elements directly dictates the dimensional margin at the longitudinal ends of the individual chips after dicing.

Thus, the following description is focused on the dicing operation performed in the lateral direction.

As described previously, when cutting the wafer in the lateral direction, the chips must have a dimensional margin less than P/2 at their longitudinal ends as shown in FIGS. 12 and 13 after the wafer has been cut. Thus, the dicing blade 23 is positioned with respect to the wafer using the positioning mark 17 so as to meet the following conditions. That is, the width W of the interlayer dielectric 13 formed on the chip is less than P/2. The edge line of the interlayer dielectric is used as the positioning mark 17. However, it is to be noted that the smaller P is made in an attempt to implement a high resolution light-receiving diode array or a light-emitting diode array, the narrower the width W of the interlayer dielectric becomes. Thus, as shown in FIG. 13, the unwanted, unused impurity diffusion areas 19 will become continuous with the impurity diffusion area 15 which is used as a last light-emitting element. This unwanted continuity of impurity diffusion areas gives rise to another problem.

If the interlayer dielectric serves as a diffusion mask, the interlayer dielectric must have a certain width W at the chip ends. However, as mentioned above, the chips must have a dimensional margin less than P/2 at their longitudinal ends. Thus, the dicing blade 23 cuts the interlayer dielectric 13, increasing the chance of the interlayer dielectric near the chip ends becoming detached from the substrate. If the interlayer dielectric includes a first interlayer dielectric and a second interlayer dielectric, a problem frequently occurs that the second interlayer dielectric becomes detached from the first interlayer dielectric.

If the interlayer dielectric becomes detached from the first interlayer dielectric near the impurity diffusion area 15, the light-emitting element closest to the interlayer dielectric emits light of a different power from other light-emitting portions. This causes poor print quality of the printer. If the detachment of the interlayer dielectric spreads to the individual electrodes 21, the individual electrodes 21 are short-circuited to the substrate 11.

SUMMARY OF THE INVENTION

An object of the invention is to provide a method of manufacturing a light-receiving diode array or light-emitting diode array where when a wafer having a plurality of light-receiving diodes or light-emitting diodes fabricated therein is cut into individual chips, there will be less chance that the interlayer dielectric will become detached as compared to the prior art device.

Another object of the invention is to provide a method of manufacturing a light-receiving diode array or light-emitting diode array where an unwanted impurity diffusion area does not reach the impurity diffusion areas which operate as light-emitting elements or light-receiving elements.

A method of manufacturing a light-emitting diode array chip or a light-receiving diode array chip, comprise the following steps:

A first interlayer dielectric is formed in each of a plurality of chip areas on a substrate of a first conductivity type. The first interlayer dielectric has a row of a plurality of windows formed therein spaced apart by a predetermined center-to-center distance. The first area extends outwardly of the chip area at least in the vicinity of a last window of the plurality of windows, over a predetermined distance D (D>P/2) from a center of the last window in a direction of the row.

Impurity diffusion regions of a second conductivity type is formed in the substrate using the first interlayer dielectric as a diffusion mask.

An electrode is formed in contact with each of the impurity diffusion regions.

The substrate is separated or cut so that the plurality of chip areas are separated into individual chips.

The method may further include the steps of forming a second interlayer dielectric on the first interlayer dielectric after the step of forming the impurity diffusion regions. The second interlayer dielectric is formed such that the second interlayer dielectric is absent from a second area along which the substrate is diced into the individual chips, at least in the vicinity of the last window.

The method still further includes the step of forming at least one elongated pattern on the interlayer dielectric. The elongated pattern extending perpendicular to the row of the windows and in parallel with an area along which the substrate is separated into individual chips, the elongated pattern being formed before the step of separating the substrate into individual chips. The elongated pattern may be formed at the same time as the electrode is formed.

The method further includes the step of removing the first interlayer dielectric such that the first interlayer dielectric is absent from the second area, at least in the vicinity of the last window. The first interlayer dielectric is removed at the second area after the step of forming impurity regions and before the substrate is separated into individual chips.

Further the scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Preferred embodiments will be described in detail with reference to the drawings. The drawings schematically show the invention so as enable one ordinary skilled in the art to practice the invention. Like elements have been given like references throughout the drawings. While the present invention is applicable both to light-emitting elements and to light-receiving elements, the invention will be described with respect to a light-emitting diode array chip.

First Embodiment

A first embodiment is directed to a case where an interlayer dielectric includes first and second interlayer dielectric portions, formed one over the other and in which the second interlayer dielectric portion is prevented from becoming detached from the first interlayer dielectric portion during the dicing process. The first embodiment will be described with reference to FIGS. 1–3.

Figure 1:
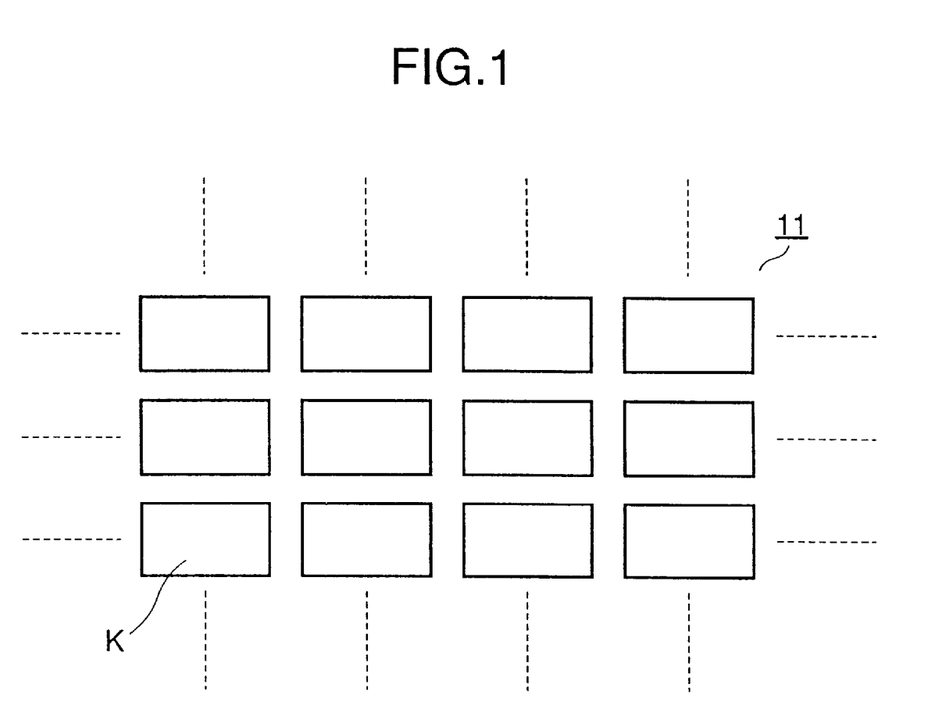
FIG. 1 illustrates a plurality of regions K formed on the semiconductor substrate according to the invention.
Figure 2:
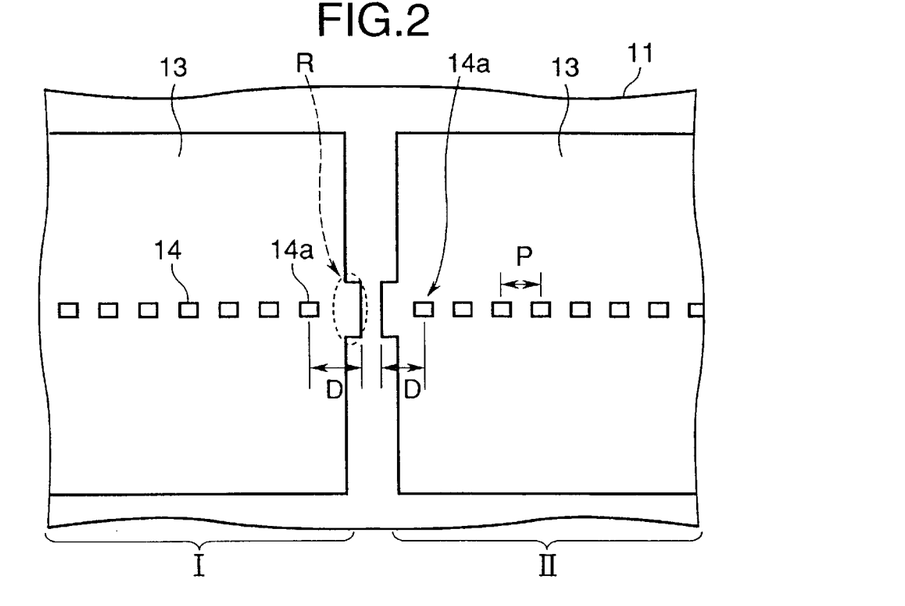
FIG. 2 is an enlarged top view of the substrate 11 of FIG. 1, showing two adjacent regions I and II of a first embodiment.

First, a semiconductor substrate 11 of a first conductivity type is prepared. The substrate 11 is, for example, an n-type GaAs substrate on which a layer of GaAsP or GaAlAs is epitaxially grown. FIG. 1 illustrates a plurality of regions K formed on the semiconductor substrate 11, each region longitudinally extending and defining a chip area in which a light emitting diode array chip will be formed. FIG. 2 is an enlarged top view of the substrate 11 of FIG. 1, showing two adjacent regions I and II.

As shown in FIG. 2, a first interlayer dielectric 13 is formed in each of the plurality of chip areas, e.g., regions I and II on the substrate 11. The first interlayer dielectric 13 has a plurality of windows 14 formed therein through which the substrate 11 is exposed. The plurality of windows 14 are formed at predetermined intervals P, i.e., the center-to-center distance between adjacent windows is P.

Although each chip area has a first interlayer dielectric 13 separate from other chip areas in the first embodiment, the first interlayer dielectric 13 may also be formed continuous with that of the other chip areas.

As shown in FIG. 2, a portion R of the first interlayer dielectric 13 extends outwardly of the chip area at a location near the last window 14a. The portion R extends from a center of the last window 14a over a distance D longer than a half the interval P between adjacent windows.

Impurity diffusion areas of a second conductivity type which function as a light-emitting element are then formed through the windows 14 in the substrate 11. The impurity diffusion areas diffuses laterally to some extent under the first interlayer dielectric. The impurity diffusion areas of the second conductivity are also formed in areas surrounding the first interlayer dielectric 13 but are not used as light-emitting elements.

The extended portion R prevents the unused impurity diffusion area formed around the first interlayer dielectric 13 from reaching that formed in the last window 14a (light emitting element 15a in FIG. 3) which is the closest to the extended portion R. The edge line of the first interlayer dielectric 13 except the extended portion R is used as a positioning mark for the dicing blade during the dicing process.

The first interlayer dielectric 13 may be of any material, for example, aluminum nitride (AlN).

Too small a thickness of the first interlayer dielectric 13 loses its function of a diffusion mask that prevents the impurity from diffusing into areas other than the areas exposed through the window 14. Too large a thickness results in cracks in the first interlayer dielectric 13 and places limitations on the patterning of the first interlayer dielectric 13. Thus, the thickness of the first interlayer dielectric 13 is preferably about 200 nm.

Figure 3:
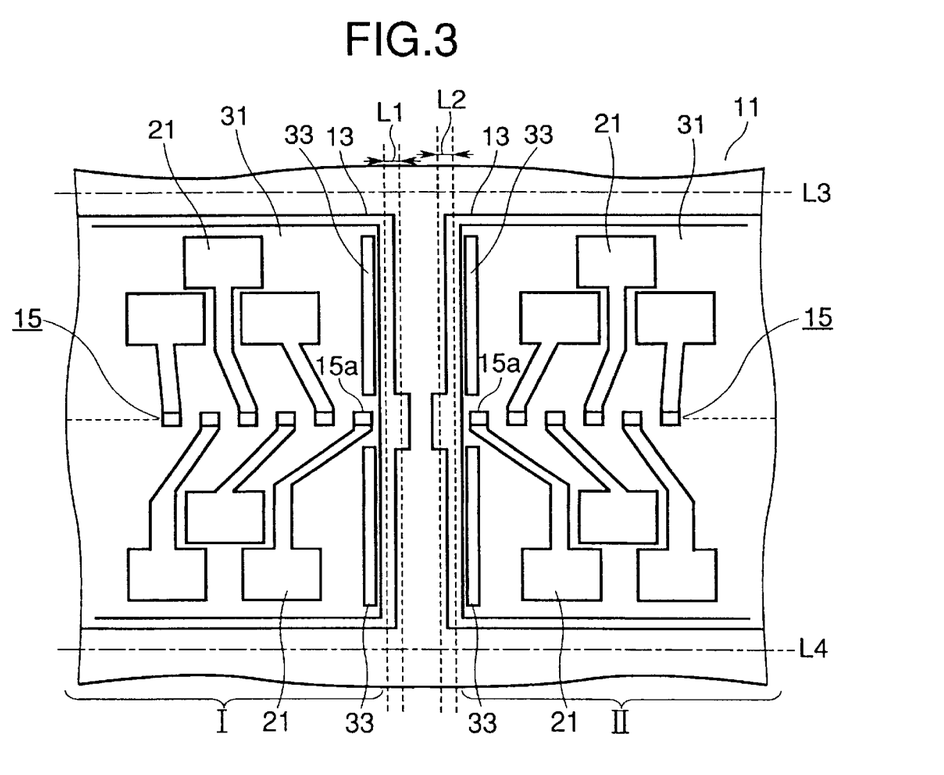
FIG. 3 illustrates two arbitrary, adjacent light-emitting diode array chips formed on a semiconductor substrate according to the first embodiment.

Next, the first interlayer dielectric 13 is used as a diffusion mask to form the impurity diffusion areas 15 in the substrate 11 as shown in FIG. 3, the impurity diffusion areas 15 functioning as a light-emitting element in a finished chip. The diffusion process is performed by introducing a second conductivity type impurity into the substrate 11 through the windows 14, the impurity being, for example, Zn and diffused in a usual manner.

Provision of the Second Interlayer Dielectric

When patterning the first interlayer dielectric 13, if pin holes occur in the first dielectric 13, the impurity diffuses into the substrate 11 through the pin holes to form unwanted, unused impurity diffusion areas during the impurity diffusion process. If the unwanted second conductivity type impurity areas are formed within areas in which the individual electrodes are formed at a later stage, the electrodes are in direct contact with the unwanted impurity diffusion areas, causing currents to flow into the unwanted impurity diffusion areas. Such currents cause a defective operation and an insufficient amount of light is emitted from the light-emitting elements. In order to maintain the yield of chips even when pin holes are developed in the first interlayer 13, a second interlayer dielectric 31 is formed on the first interlayer dielectric 13 after having formed the impurity diffusion areas.

The second interlayer dielectric 31 is first formed on the entire surface of the substrate 11 on which the first interlayer dielectric 13 has been formed. The second interlayer dielectric 31 is formed with windows therein in alignment with the windows 14 formed in the first interlayer dielectric 13.

Etching of the Second Interlayer Dielectric

The second interlayer dielectric 31 is then etched away such that the second interlayer dielectric 31 is absent from the paths L1 and L2 show in FIG. 3 of the dicing blade along which the substrate 11 is cut into individual chips during the dicing process, at least in the areas lying in the vicinity of the last light-emitting elements 15a (impurity diffusion areas) in the chip regions I and II. In other words, at least in the areas on the paths L1 and L2 close to the last light-emitting element 15a, the second interlayer dielectric 31 is within the perimeter of the first interlayer dielectric 13 and outside of the paths L1 and L2, so that the dicing blade will not cut the second interlayer dielectric 31 during the dicing process. In the embodiment, shown in FIG. 2, the entirety of the second interlayer dielectric 31 lies within the perimeter of the first interlayer dielectric 13, and does not extend to the perimeter.

The second interlayer dielectric 31 is formed of a material that can be selectively etched with respect to the first interlayer dielectric 13. The material may be, for example, silicon nitride (SiN).

The second interlayer dielectric 31 has a thickness that provides sufficient isolation between the electrodes and the pin holes developed in the first interlayer dielectric 13. The thickness is, for example, 100 nm.

The following is a reason that the second interlayer dielectric 31 is etched away at least in the areas defined by the paths L1 and L2 close to the last light-emitting elements 15a of the chips.

A light-emitting diode array includes a plurality of chips arranged in line on a printed circuit board and each chip has a plurality of light-emitting elements arranged in line. Therefore, the light-emitting diode array has a long, single row of a plurality of light-emitting elements. As described previously, if the chips are to be mounted on the circuit board such that the distance between the last light-emitting elements on the adjacent chips is equal to interval P, the first and last light-emitting elements on each chip should be located at a distance of less than P/2 from the chip end.

Thus, the substrate 11 is cut in an area extremely close to the last light-emitting element 15a of the chip. The light-emitting elements are arranged at intervals of, for example, about 21 microns if the light-emitting diode array is to provide a resolution of 1200 DPI. In order to ensure intervals of 21 microns between the last light-emitting elements of two adjacent chips when the two chips are arranged on the circuit board, each chip must be diced so that the diced chips will have a distance of less than 10.5 microns between the longitudinal edge of the chip and the last light-emitting element 15a.

The second interlayer dielectric 31 does not strongly adhere to the first interlayer dielectric 13 and may become detached easily if the dicing blade directly cuts the second interlayer dielectric 31. Therefore, there are chances of the dicing blade causing the second interlayer dielectric 31 to become detached from the first interlayer dielectric if the dicing blade cuts the second interlayer dielectric 31.

If the interlayer dielectric becomes detached in the vicinity of the last light-emitting element 15a of the chip, the amount of light emitted from the last light-emitting element 15a is prominently influenced. In order to eliminate or reduce the chance of the interlayer dielectric becoming detached in the vicinity of the last light-emitting element 15a of the chip, the second interlayer dielectric 31 is etched away such that the second interlayer dielectric 31 is absent from the areas shown by paths L1 and L2, at least in the areas lying in the vicinity of the last light-emitting elements 15a of the chips.

Provision of Island-shaped Pattern

Even though the second interlayer dielectric 31 is off the area along which the dicing blade passes, the first interlayer dielectric 13 is still cut by the dicing blade. Therefore, there is still a chance that the first interlayer dielectric 13 will become detached from the substrate. The detachment of the first interlayer 13 may induce the detachment of the second interlayer dielectric 31. The detachment of the interlayer dielectric extending to the last light-emitting element 15a of the chip results in deterioration of the chip characteristics and decreased yield of production of the chips.

In order to solve this problem, in the first embodiment, island-shaped patterns 33 are formed on the second interlayer dielectric extending parallel to the lines L1 and L2. The island-shaped pattern 33 is in the shape of an elongated pattern and serves as a weight which acts on the interlayer dielectric to firmly hold the interlayer dielectric onto the substrate. Thus, the island-shaped patterns 33 prevent the detachment of the interlayer dielectric from spreading further into the chips.

The island-shaped pattern 33 is preferably formed of a material having as large a specific weight as possible. For this purpose, metals are preferable but materials other than metals may of course be used. The island-shaped pattern 33 is provided in areas except the impurity diffusion areas. In the first embodiment, the island-shaped patterns 33 are formed at the same time as the individual electrodes 21 are formed, using well known film-forming techniques such as photolithography and etching techniques. Accordingly, the island-shaped patterns 33 are formed of the same material as the individual electrodes, e.g., aluminum. Simultaneously forming the island-shaped patterns 33 and the individual electrodes is advantageous since this saves one manufacturing process. The island-shaped pattern 33 is sufficient to overcome a force that causes the interlayer dielectric of a thickness of only about several hundred nanometers to become detached, preventing the detachment of the interlayer dielectric from extending into the chip.

The size and thickness of the island-shaped pattern 33 can be determined experimentally according to a specific design. If the island-shaped pattern 33 is formed of, for example, aluminum, the width and thickness of the island-shaped pattern 33 are selected to be, for example, 15 microns and 1 micron, respectively, so as to prevent the interlayer dielectric from becoming detached from the substrate.

Then, a common electrode, not shown, is formed on the underside of the substrate 11 using a known method. Of course, the common electrode can be formed at another stage of the manufacturing process.

After all of the aforementioned processes have been performed, the substrate 11 is subjected to the dicing process in which the substrate 11 is cut into individual chips using a dicing blade. As shown in FIG. 3, the substrate 11 is diced laterally along the paths L1 and L2 and longitudinally along paths L3 and L4, yielding individual light-emitting diode array chips.

A chip fabricated in the aforementioned method has less chance of the second interlayer dielectric 31 becoming detached from the first interlayer dielectric, at least in the vicinity of the last light-emitting element 15a of the chip. This is because the second interlayer dielectric 31 is absent from areas in which the dicing blade passes. Should the first interlayer dielectric 13 become detached from the substrate when the first interlayer dielectric 13 is cut by the dicing blade, the island-shaped pattern 33 prevents the first interlayer dielectric 13 from becoming further detached toward the interior of the chip.

Figure 4:
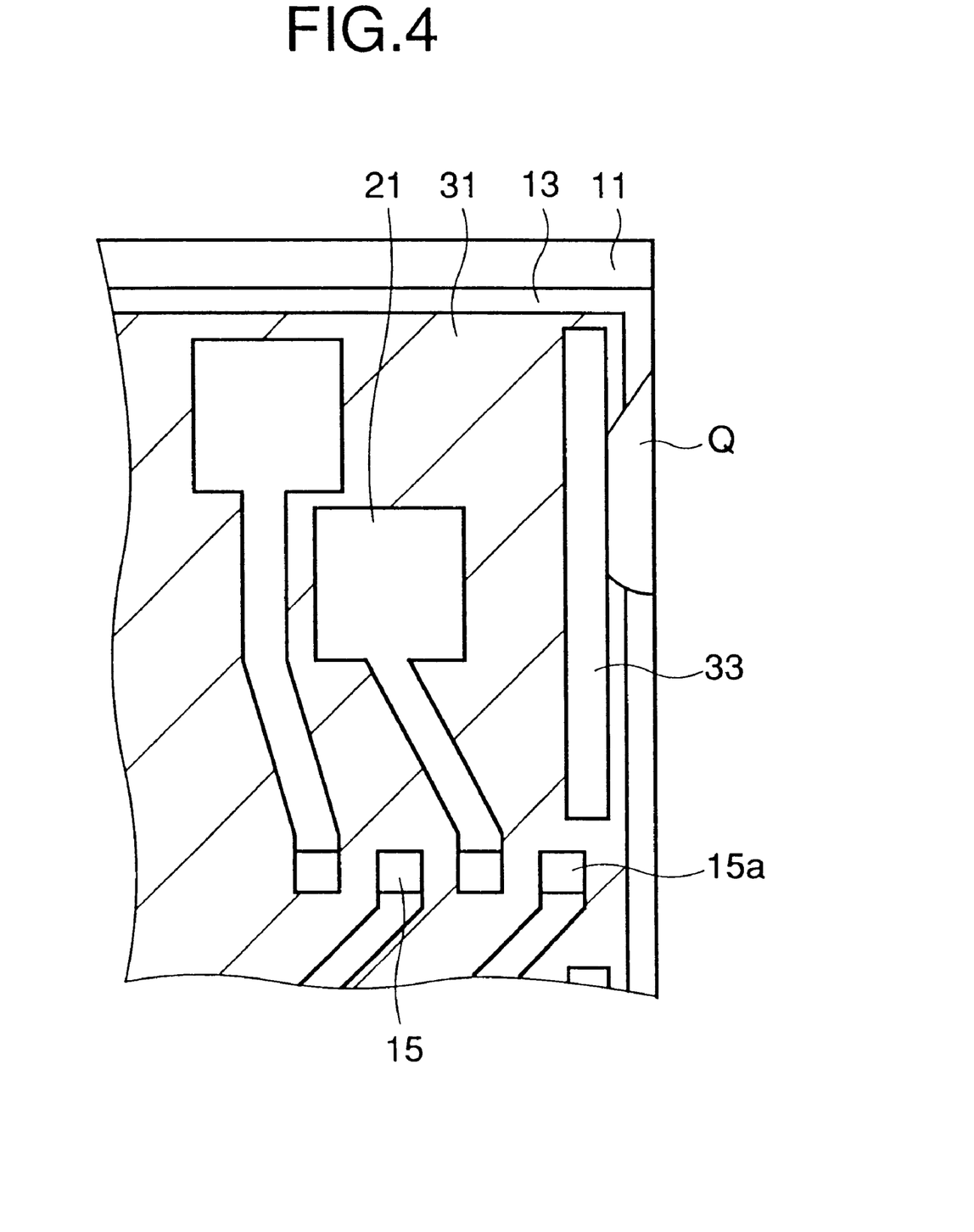
FIG. 4 is a model representation, showing that the island-shaped pattern prevents the detachment of the interlayer dielectric from extending.

FIG. 4 is a model representation, showing that the island-shaped pattern 33 prevents the detachment of the interlayer dielectric from spreading toward the interior of the chip. The interlayer dielectric has become detached from the substrate 11 in an area indicated by Q. The second interlayer dielectric 31 is shown hatched in order to visually distinguish from the rest of the parts. It is to be noted that the island-shaped pattern 33 prevents the detachment of the interlayer dielectric 31 from further developing beyond the island-shaped pattern 33.

Figure 5:
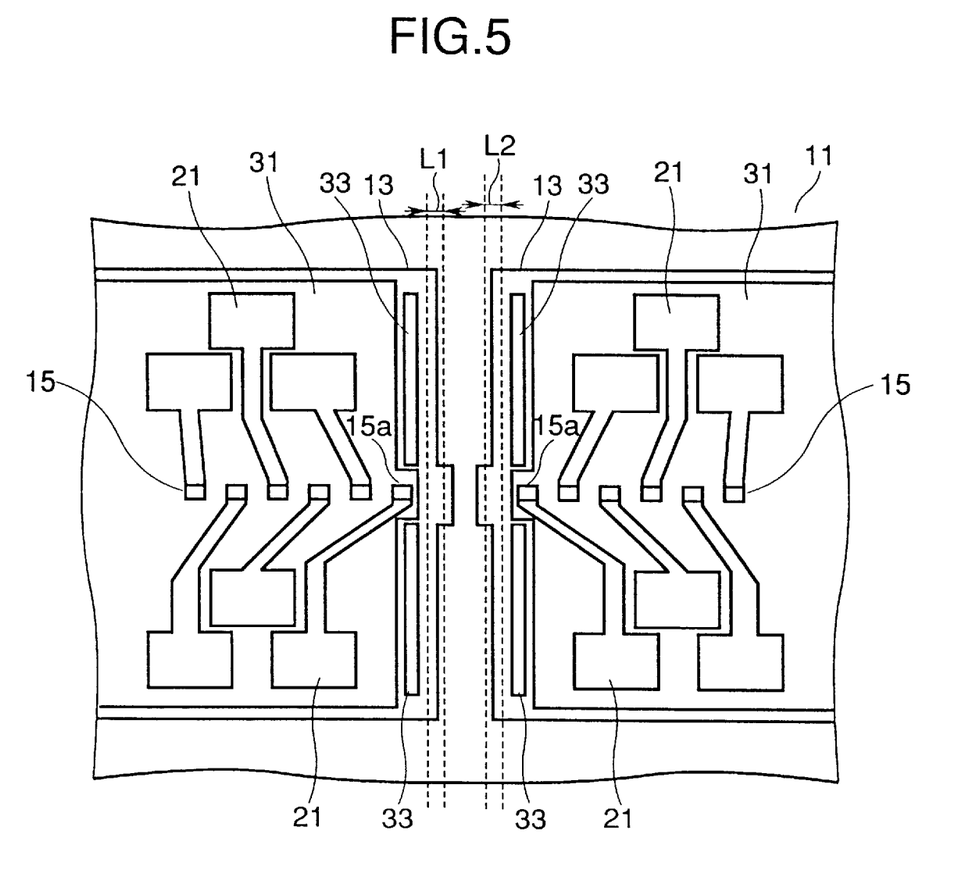
FIG. 5 illustrates another case in which the island-shaped pattern 33 is formed directly on the first interlayer dielectric 13.

FIG. 5 illustrates another case in which the island-shaped pattern 33 is formed directly on the first interlayer dielectric 13. In this case, the second interlayer dielectric 31 is absent from the area occupied by the island-shaped pattern 33.

Provision of a Single Interlayer Dielectric

Figure 6:
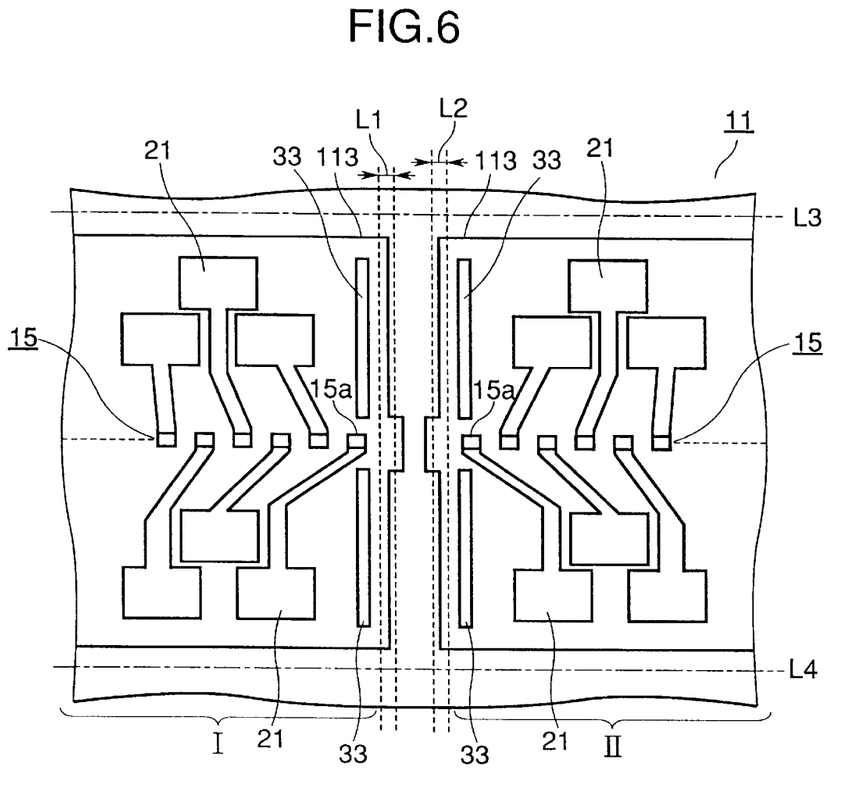
FIG. 6 illustrates a modification of the first embodiment where only a single interlayer dielectric is used.

The first embodiment has been described with the interlayer dielectric of a multilayer structure including the first interlayer dielectric and the second interlayer dielectric, the interlayer dielectric may be of a single layer. FIG. 6 illustrates two arbitrary, adjacent light-emitting diode array chips formed on a semiconductor substrate 11. The interlayer dielectric 113 is formed on the semiconductor substrate 11 in the same way as the first interlayer dielectric 13 in the example described with reference to FIG. 2. The light-emitting diode array chips are fabricated in the same way as the aforementioned chips except that the second interlayer dielectric 31 is not formed, and therefore the detailed description is omitted.

Second Embodiment

Figure 7:
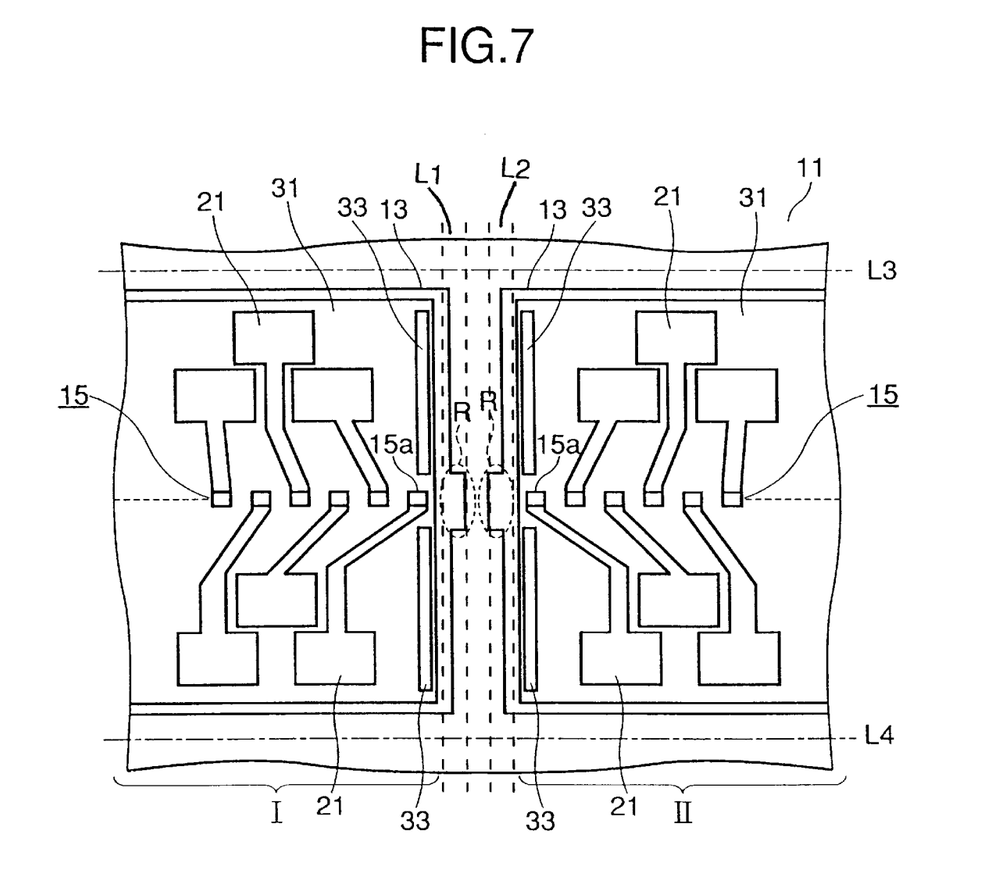
FIGS. 7 and 8 are top views showing two arbitrary chip areas on a semiconductor substrate according to a second embodiment, FIG. 7 showing the substrate before the first interlayer dielectric is removed at the portion R and FIG. 8 showing the substrate after the first interlayer dielectric has been removed.
Figure 8:
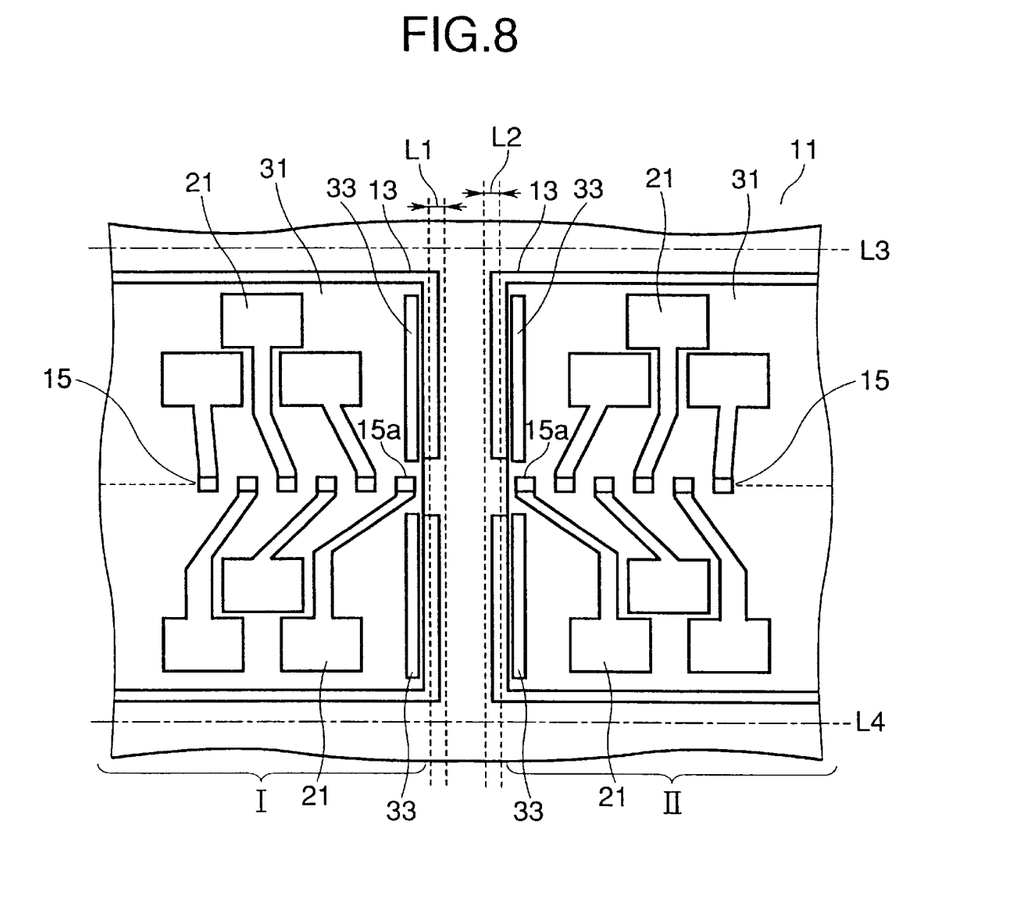

A second embodiment will be described with respect to a case where the interlayer dielectric is a multilayer including the first interlayer dielectric 13 and the second interlayer dielectric 31 and the multilayer is prevented from becoming detached when the substrate 11 is cut into individual chips. The second embodiment will be described with reference to FIGS. 7 and 8. FIGS. 7 and 8 are top views showing arbitrary two chip areas of a substrate 11, regions I and II, at one of the main manufacturing processes, the regions I and II defining chip areas in which light-emitting diode chips are formed.

A first interlayer dielectric 13 is first formed in each of a plurality of regions (also referred to as chip areas) on the substrate 11 Just as in the first embodiment shown in FIG. 2. The regions will be separated by cutting the substrate 11 into individual chips at a later stage of the manufacturing process. The first interlayer dielectric 13 has a plurality of windows 14 formed therein through which the substrate 11 is exposed. The plurality of windows 14 are formed in an array configuration at predetermined intervals, i.e., center-to-center distance of P.

In the second embodiment, although each chip area has the first interlayer dielectric 13 separate from other chip areas, the first interlayer dielectric 13 may be formed continuous over the plurality of chip areas.

The first interlayer dielectric 13 laterally extends at R outwardly of the chip area near the last light-emitting element 15a.

The extended portion R prevents a later described unwanted, unused diffusion area formed around the first interlayer from reaching the impurity diffusion area (light-emitting element 15a in FIG. 7) formed in the last window 14a. The edge line of the first interlayer dielectric 13 except the extended portion R is used as a positioning mark when the substrate 11 is cut into individual chips with a dicing blade.

The edge line of the first interlayer dielectric 13 except for the extended portion R may be located at a position where the distance between the edge of the chip and the last light-emitting element 15a of the chip is less than P/2 after dicing.

Subsequently, using the first interlayer dielectric 13 as a diffusion mask, impurity diffusion areas 15 of a second conductivity type that function as light-emitting elements are formed in the windows 14. Impurity diffusion areas of the second conductivity type are also formed around the first interlayer dielectric 13 but not used as light-emitting elements.

After the formation of impurity diffusion areas, the second interlayer dielectric 31 is formed on the first interlayer dielectric 13. In the same way as in the first embodiment, the second interlayer dielectric 31 is formed such that the interlayer dielectric is absent from the paths L1 and L2 in FIG. 7 along which the substrate is cut into individual chips during the dicing process, the areas lying in the vicinity of the light-emitting elements (impurity diffusion areas) in the regions I and II. In the second embodiment, the entire second interlayer dielectric 31 is formed within the perimeter of the first interlayer dielectric 13, not extending to the perimeter.

Just as in the first embodiment, the individual electrodes 21 and island-shaped patterns 33 are formed as shown in FIG. 7.

In the second embodiment, the extended portions R of the first interlayer dielectric 13 shown in FIG. 7 are removed by, for example, etching, so that the interlayer dielectric is discontinuous near the last light-emitting element 15a as shown in FIG. 8. The removal of the extended portion R can be accomplished by using known photolithography technique and etching technique. By this structure, a substrate can be fabricated where there is neither the first interlayer dielectric 13 in the vicinity of the light-emitting element of the chip ends nor is there the second interlayer dielectric 31.

The process of selectively removing the extended portion R of the first interlayer dielectric 13 may be performed at any stage after the impurity diffusion areas of the second conductivity type have been formed but before the substrate 11 is diced.

It is to be noted that when forming the impurity diffusion areas 15, the extended portion R of the first interlayer dielectric serves to cover areas in the vicinity of the last light-emitting element 15a, preventing unwanted impurity diffusion areas from reaching the impurity diffusion areas which will function as light-emitting elements. After the impurity diffusion areas have been formed, the extended portion R of the first interlayer dielectric is removed.

Then, a common electrode, not shown, is formed on the underside of the substrate 11.

After the substrate has been subjected to all of the aforementioned processes, the substrate 11 is cut into individual chips by using a dicing blade just as in the first embodiment. The resulting chips are light-emitting diode array chips.

With the chips fabricated by the second embodiment, there is less chance of the first interlayer dielectric 13 and the second interlayer dielectric 31 becoming detached at least in the vicinity of the last light-emitting element 15a of the chip. The first interlayer dielectric 13 and the second interlayer dielectric 31 are completely absent from the area along which the dicing blade passes, at least in the vicinity of the last light-emitting element 15a of the chip. Therefore, even if the interlayer dielectric becomes detached in areas other than the area in the vicinity of the last light-emitting element 15a of the chip, the island-shaped pattern 33 prevents the detachment of the interlayer dielectric 31 from extending further into the chip.

The second embodiment has been described with respect to a case where the extended portion R of the first interlayer dielectric is removed from an area near the last light-emitting element 15a of the chip, the area being in the path along which the dicing blade passes. The first interlayer dielectric 13 may be removed over a much wider area as far as the dicing blade may be appropriately positioned on the path along which the substrate 11 is cut into individual chips.

Figure 9:
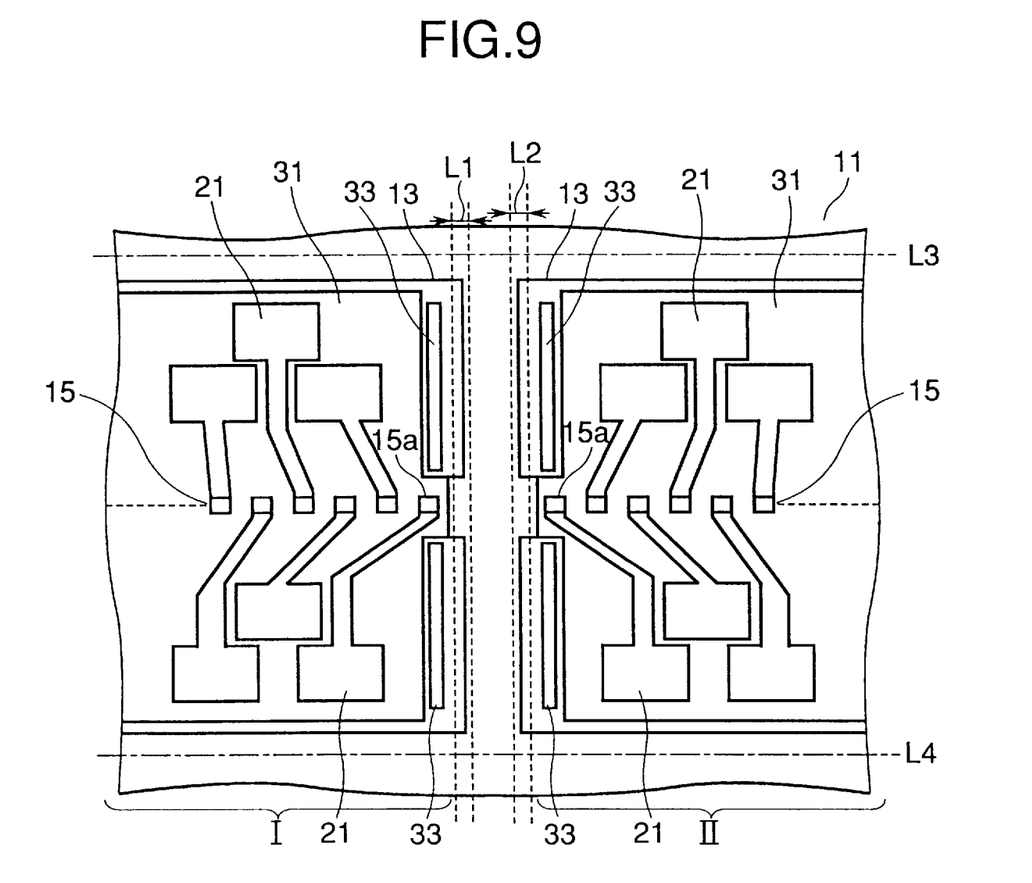
FIG. 9 illustrates a case in which the island-shaped pattern 33 is formed directly on the first interlayer dielectric.

FIG. 9 illustrates another case in which the island-shaped pattern 33 is formed directly on the first interlayer dielectric 13. In this case, the second interlayer dielectric 31 is absent from the area occupied by the island-shaped pattern 33.

Provision of a Single Interlayer Dielectric

Although the second embodiment has been described with the interlayer dielectric of a multilayer structure including the first interlayer dielectric and the second interlayer dielectric, the interlayer dielectric may be of a single layer.

Figure 10:
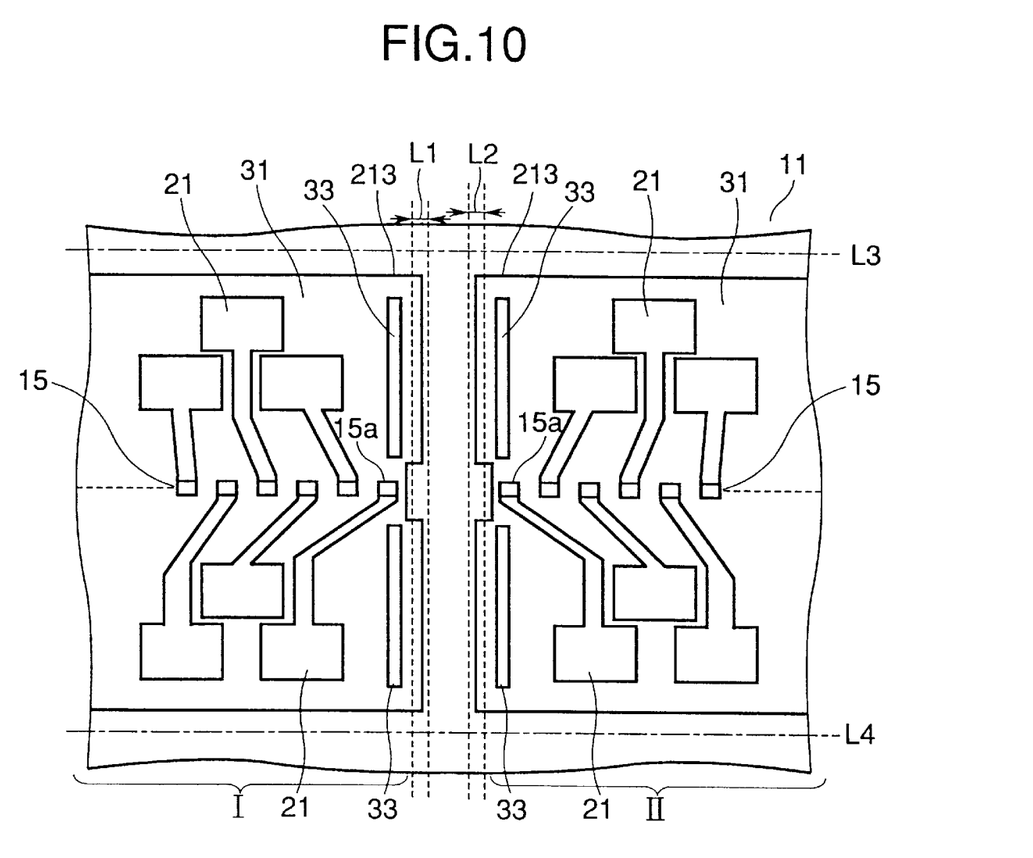
FIG. 10 illustrates two arbitrary, adjacent light-emitting diode array chips formed on a semiconductor substrate.

FIG. 10 illustrates two arbitrary, adjacent light-emitting diode array chips formed on a semiconductor substrate 11. The interlayer dielectric 213 is formed on the semiconductor substrate 11 in the same way as shown in FIG. 6. The light-emitting diode array chips are fabricated in the same way as the aforementioned chips of the second embodiment except that the second interlayer dielectric 31 is not formed, and therefore the detailed description is omitted.

The present invention is not limited to the aforementioned first and second embodiments, and modifications may be made in various forms.

While the aforementioned invention has been described with respect to light-emitting diode array chips, the invention is also applicable to the manufacture of light-receiving diode array chips.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a light-emitting or a light-receiving diode array chip, comprising the steps of:

forming a first interlayer dielectric in each of a plurality of chip areas on a substrate of a first conductivity type, the first interlayer dielectric having a row of a plurality of first windows formed therein spaced apart by a center-to-center distance P and a first area extending outwardly of the chip area, the substrate being diced at an inner side of the first area at least in the vicinity of a last one of the plurality of first windows, the first area extending over a distance D from a center of the last one of the first windows in a direction of the row, where D is greater than P/2;

forming impurity diffusion regions of a second conductivity type in the substrate using the first interlayer dielectric as a diffusion mask;

forming an electrode in contact with each of the impurity diffusion regions; and separating the substrate so that the plurality of chip areas are separated into individual chips, the substrate being diced at a distance which is not greater than half the center-to-center distance from the center of the last one of the plurality of first windows.

2. The method according to claim 1, further comprising the step of:

forming a second interlayer dielectric on the first interlayer dielectric after the step of forming the impurity diffusion regions, the second interlayer dielectric being formed such that the second interlayer dielectric is absent from a second area along which the substrate is separated into the individual chips, at least in the vicinity of the last one of the plurality of windows, the second interlayer dielectric having a plurality of second windows formed therein in alignment with the plurality of first windows.

3. The method according to claim 2, further comprising the step of:

forming at least one elongated pattern on the second interlayer dielectric, the elongated pattern extending substantially perpendicular to the row of the second windows and substantially in parallel with an area along which the substrate is separated into individual chips, the elongated pattern being formed before the step of separating the substrate into individual chips.

4. The method according to claim 3, wherein said elongated pattern is made of a metal, and said elongated pattern is formed during the step of forming the electrode.

5. The method according to claim 2, wherein the electrode is formed on the second interlayer dielectric.

6. The method according to claim 2, further comprising the step of removing the first interlayer dielectric such that the first interlayer dielectric is absent from the second area, at least in the vicinity of the last one of the plurality of first windows, the first interlayer dielectric being removed after the step of forming impurity diffusion regions and before the step of separating the substrate into individual chips.

7. The method according to claim 2, further comprising the step of:

forming at least one elongated pattern on the first interlayer dielectric, the elongated pattern extending substantially perpendicular to the row of second windows and substantially in parallel with an area along which the substrate is separated into individual chips, the elongated pattern being formed before the step of separating the substrate into individual chips.

8. The method according to claim 1, further comprising the step of:

forming at least one elongated pattern on the first interlayer dielectric, the elongated pattern extending substantially perpendicular to the row of the plurality of first windows and in parallel with an area along which the substrate is separated into individual chips, the elongated pattern being formed before the step of separating the substrate into individual chips.

9. The method according to claim 8, wherein said elongated pattern is made of a metal, and said elongated pattern is formed during the step of forming the electrode.

10. The method according to claim 1, further comprising the step of removing the first interlayer dielectric such that the first interlayer dielectric is absent from the second area, at least in the vicinity of the last one of the plurality of first windows, the first interlayer dielectric being removed after the step of forming impurity diffusion regions and before the step of separating the substrate into individual chips.

11. The method according to claim 1, wherein the electrode is formed on the first interlayer dielectric.

* * * * *